(12) United States Patent
Abe

(10) Patent No.: US 7,752,490 B2
(45) Date of Patent: *Jul. 6, 2010

(54) MEMORY SYSTEM HAVING A HOT-SWAP FUNCTION

(75) Inventor: Takashi Abe, Tokyo (JP)

(73) Assignee: NEC Corporation (JP)

( * ) Notice: Subject to any disclaimer, the term of this patent is extended or adjusted under 35 U.S.C. 154(b) by 563 days.

This patent is subject to a terminal disclaimer.

(21) Appl. No.: 11/388,290

(22) Filed: Mar. 24, 2006

(65) Prior Publication Data

US 2006/0217917 A1    Sep. 28, 2006

(30) Foreign Application Priority Data

Mar. 25, 2005    (JP)    ............... 2005-088800

(51) Int. Cl.
    *G06F 11/00*    (2006.01)
(52) U.S. Cl. .......................... 714/7; 710/302
(58) Field of Classification Search .............. None
    See application file for complete search history.

(56) References Cited

U.S. PATENT DOCUMENTS

| | | | | |
|---|---|---|---|---|
| 4,914,625 A | * | 4/1990 | Billian | ............ 714/2 |
| 6,038,680 A | * | 3/2000 | Olarig | ............ 714/6 |
| 6,047,343 A | * | 4/2000 | Olarig | ......... 710/302 |
| 6,370,604 B1 | | 4/2002 | Sreekanti | |
| 6,401,157 B1 | * | 6/2002 | Nguyen et al. | ......... 710/302 |
| 6,651,138 B2 | * | 11/2003 | Lai et al. | .......... 711/115 |
| 6,715,104 B2 | * | 3/2004 | Imbert de Tremiolles et al. | ........... 714/25 |
| 6,766,469 B2 | * | 7/2004 | Larson et al. | .......... 714/7 |
| 6,785,785 B2 | * | 8/2004 | Piccirillo et al. | ......... 711/157 |
| 6,854,070 B2 | * | 2/2005 | Johnson et al. | .......... 714/5 |
| 7,035,953 B2 | * | 4/2006 | Krontz et al. | .......... 710/302 |
| 7,076,686 B2 | * | 7/2006 | La Fetra | .......... 714/6 |
| 7,194,581 B2 | * | 3/2007 | Vogt | .......... 711/131 |
| 7,350,089 B2 | * | 3/2008 | Mundada et al. | .......... 713/300 |
| 2002/0129186 A1 | * | 9/2002 | Emerson et al. | .......... 710/302 |
| 2003/0079073 A1 | * | 4/2003 | Richard et al. | .......... 710/302 |
| 2006/0020740 A1 | * | 1/2006 | Bartley et al. | .......... 711/100 |
| 2006/0095592 A1 | * | 5/2006 | Borkenhagen | .......... 710/2 |
| 2006/0198114 A1 | * | 9/2006 | Coutancier et al. | .......... 361/788 |

FOREIGN PATENT DOCUMENTS

| | | |
|---|---|---|
| CN | 1504908 | 6/2004 |
| JP | 06-230863 | 8/1994 |
| JP | 2001-167001 | 6/2001 |
| JP | 2003-208358 | 7/2003 |
| JP | 2004-185199 | 7/2004 |

OTHER PUBLICATIONS

Office Action issued by the Chinese Patent Office on Apr. 20, 2007 in connection with corresponding Japanese Patent Application No. 2005-088800.

(Continued)

*Primary Examiner*—Gabriel L Chu
(74) *Attorney, Agent, or Firm*—Ostrolenk Faber LLP

(57) ABSTRACT

A memory system includes normal memory modules serially connected, and a backup memory module, and a switch circuit for replacing a failed one of the normal memory modules by the backup memory module. The switch circuit inserts the backup memory module in the serial connection of the normal memory modules excepting the failed normal memory module.

4 Claims, 6 Drawing Sheets

OTHER PUBLICATIONS

Translation of Office Action issued by the Chinese Patent Office on Apr. 20, 2007 in connection with corresponding Japanese Patent Application No. 2005-088800.

Translation of Office Action issued by the Chinese Patent Office on Jun. 9, 2009 in connection with corresponding Japanese Patent Application No. 2005-088800.

* cited by examiner

MEMORY SYSTEM HAVING A HOT-SWAP FUNCTION

BACKGROUND OF THE INVENTION

1. Field of the Invention

The present invention relates to a memory system having a hot-swap function and, more particularly, to a memory system having serially-connected memory modules, capable of performing a hot-swap operation that replaces a failed memory module by a backup memory module without stopping operation of the memory system. The present invention also relates to a hot-swap method in such a memory system.

2. Description of the Related Art

There is known an information processing system having a plurality of memories (memory modules) connected to each other in a serial connection to allow a memory controller to control the data writing/reading operations. When a failure occurs in one memory module in such an information processing system, the entire system must be stopped in order to replace the failed memory module with another memory module, in general. This is because interruption of an access to the memory system makes it impossible to allow the information processing system to continue the processing operation.

As a method that replaces a failed memory module without stopping operation of the information processing system, a mirroring technique is known in which the bus has a redundancy configuration. FIG. 13 shows this mirroring technique. In the mirroring technique, there is provided a normal bus 102 to which memory modules 104, 105 and 106 in service are connected, as well as a backup bus 103 having a configuration similar to the normal bus 102, to which memory modules 107, 108 and 109 having a configuration similar to that of the memory modules 104, 105 and 106 are connected. If a failure occurs in any of the memory modules 104, 105 and 106, a memory controller 101 firstly recreates the data of the failed memory module from redundant data of other normal memory modules and migrates the data of the respective memory modules including the recreated data, to the corresponding backup memory modules. Then, the memory controller 101 stops operation of the normal bus 102 and switches to the backup bus 103 so as to perform a subsequent processing. After replacement of the failed memory module has been completed, the memory controller 101 switches from the backup bus 103 to the normal bus 102 to perform a normal processing. There is substantially no possibility of occurring of an error in the mirroring technique, and it is regarded as a reliable method. However, it requires memory modules twice as much a capacity as memory modules in service have, thereby resulting in an increase of the cost.

FIG. 14 shows a memory system having a plurality of memory modules, in which a single backup memory module 15 is provided for normal memory modules 11 to 14. When a failure occurs in any of the memory modules 12 to 14, an access from a memory controller 10 is switched from the failed memory module to the backup memory module 15. In this method, although it is possible to stop the failed memory module while the system is being run, replacement of a memory module, i.e., removal of the failed memory module and introduction of a new memory module in service cannot be performed without stopping the entire processing system. In this case, the backup memory module 15 can be turned on/off using a switch. However, when the switch is operated while the memory access is being executed, a transmission waveform may be adversely affected by the switching, thereby preventing a stable operation of the processing system.

In recent years, a memory system in which a plurality of serially-connected memory modules are used to perform a serial transmission has been put in a practical use. FIG. 15 shows an example of such a memory system using a conventional serial transmission scheme. As shown in FIG. 15, buffers 22 to 24 are provided for respective memory modules 19 to 21, and the transmission of a signal from a memory controller 25 is controlled in one direction by using a dedicated write bus 18 and a dedicated read bus 17. In this memory system, when power supply for a specific memory module is stopped, signal transmission to the next memory module is disabled. Thus, in the conventional memory system using a serial transmission scheme, it is impossible to disconnect the memory module without stopping operation of the processing system.

Patent Publication JP-2004-185199A (FIG. 13) describes a memory system using a serial transmission scheme capable of performing a hot-swap operation. When a failure occurs in this memory system, data is migrated to a hard disk drive and then switching from a serial transmission line to a bi-directional transmission line is performed, thereby allowing the disconnection of a failed memory module without interruption of power supply.

In the memory system described in JP-2004-185199A, data is migrated to a hard disk drive to allow the disconnection of a failed memory module. However, since the access speed of a memory and that of a hard disk differ from each other, it is impossible to allow the memory system to operate in a normal mode because the data is stored on the hard disk having a lower access speed.

SUMMARY OF THE INVENTION

It is an object of the present invention to provide a memory system, in which a backup memory module is provided in a memory system using a serial transmission scheme, capable of replacing a failed memory module by the backup memory module in a hot-swap function without the need to stop the operation of an information processing system and without deteriorating its stable operation.

It is another object of the present invention to provide a hot-swap method for use in such a memory system.

The present invention provides a memory system including: a plurality of normal memory modules serially connected by a signal write line and a signal read line for transferring read/write data; a backup memory module; and a switch circuit for replacing one of the normal memory modules by the backup memory module by isolating the one of the normal memory modules and inserting the backup memory module to serially connect the backup memory module and the normal memory modules excepting the one of the normal memory modules.

The present invention also provides a method for hot-swapping in a memory system including a plurality of normal memory modules, a backup memory module and a signal write line and a signal read line for connecting the normal memory modules in a serial connection, the method including the steps of: isolating one of the normal memory modules from the serial connection of the normal memory modules; and inserting the backup memory module in the serial connection of the normal memory modules excepting the isolated one of the normal memory modules.

In accordance with the memory system and hot-swap method of the present invention, it is not necessary to stop access from the memory controller to the memory system even when data is migrated from a failed memory module to the backup memory module. As a result, a hot-swap operation can be realized, in which it is possible to replace a failed memory module by the backup memory module while an information processing system is being run.

In the memory system according to a preferred embodiment of the present invention, the switch circuit has a switch provided with one input terminal and two output terminals and a transmission-direction limiting gate provided with two input terminals and one output terminal. The transmission-direction limiting gate transmits a signal in one direction from the input terminal to output terminals. The configuration of the memory system according to the present invention can be realized by using the above simple structure of the switch circuit.

Further, in one aspect of the present invention, the transmission-direction limiting gate includes cascade-connected first and second buffers and a third buffer having an output terminal connected to a node connecting together the first and second buffers. Similarly, the configuration of the memory system according to the present invention can be realized by using the above simple structure of the transmission-direction limiting gate.

DETAILED DESCRIPTION OF THE PREFERRED EMBODIMENTS

Figure 1:
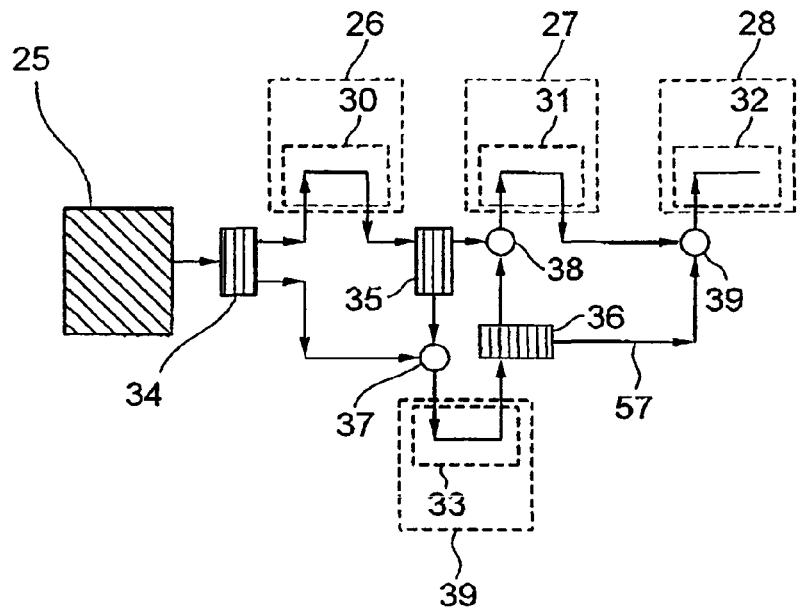
FIG. 1 is a block diagram showing a memory system according to an embodiment of the present invention.
Figure 15:
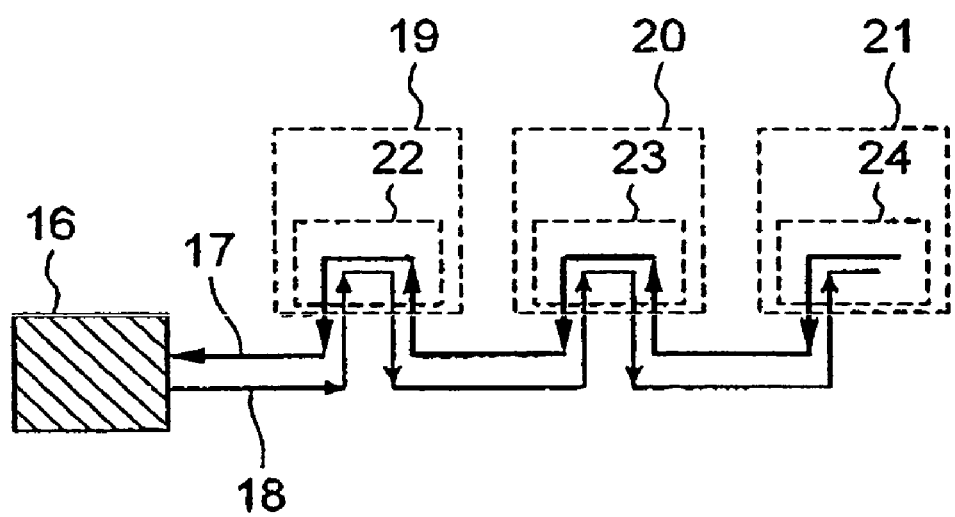
FIG. 15 is a block diagram showing a conventional memory system adopting a serial transmission scheme.

FIG. 1 shows the configuration of a memory system according to an embodiment of the present invention. The memory system includes a memory controller 25, a plurality of (three) normal memory modules 26 to 28, a single backup memory module 29, a signal line which serially connects the memory module 26 to 28 and performs a serial data transmission, and a switch circuit for switching connection of the signal line. More specifically, the memory system according to the embodiment of the present invention has a configuration obtained by adding a backup memory module and a switch circuit to the circuit configuration of the conventional memory system shown in FIG. 15. Although only a dedicated write line is shown in FIG. 1 for the sake of simplification, the memory system of the present embodiment includes the dedicated write line and a dedicated read line similarly to the conventional memory system of FIG. 15. The memory modules 26 to 29 include therein serial transmission buffers 30 to 33, respectively The switch circuit serially connects together the normal memory modules 26 to 28 to perform a serial data transmission during a normal operation mode of the memory system. When a failure occurs in one of the normal memory modules 26 to 28, the switch circuit disconnects or isolates the failed memory module and serially connects together the other normal memory modules and the backup memory module 29. The backup memory module 29 is inserted in the serial connection of the normal memory modules excepting the failed normal memory module.

The switch circuit includes switches 34 to 36 each provided with a single input terminal and two output terminals and transmission-direction limiting gates 37 to 39 each provided with two input terminals and a single output terminal. The transmission-direction limiting gates 37 to 39 limit the signal transmission direction, allowing a signal to be transmitted from the input terminals to the output terminal and preventing the signal from being transmitted from the output terminal to the input terminals. Power supply control for the memory modules 26 to 29 is performed under the control of the memory controller 25 independently from one another.

Figure 2:
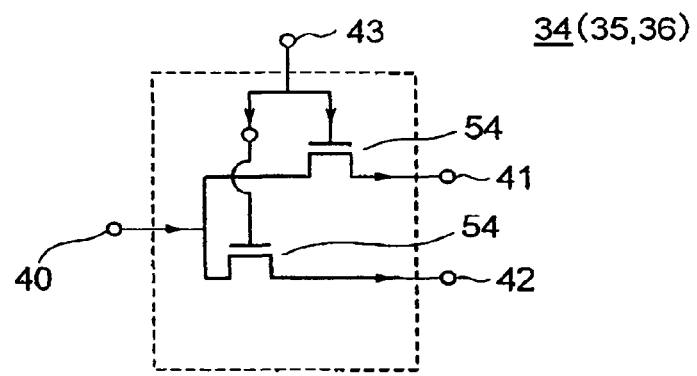
FIG. 2 is a circuit diagram showing the configuration of a switch shown in FIG. 1.

FIG. 2 shows an example of the switch 34 (35, 36). The switch 34 (35, 36) has a pair of transistors (FET) 54 each having a current path connected between a common input terminal 40 and a separate output terminal 41 or 42. One of the FETs 54 is turned ON while the other is turned OFF by a control signal fed through a control terminal 43, whereby an input signal input through the input terminal 40 is output to one of the output terminals 41 and 42 of the switch 34.

Figure 3:
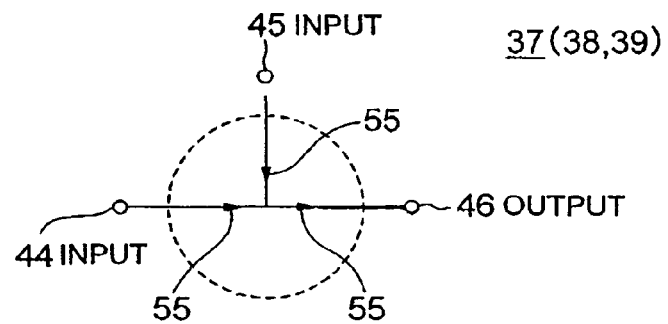
FIG. 3 is a circuit diagram showing the configuration of a transmission-direction limiting gate shown in FIG. 1.

FIG. 3 shows an example of the transmission-direction limiting gate 37 (38, 39). The transmission-direction limiting gate 37 (38, 39) is configured by three buffers 55. In the transmission-direction limiting gate 37 (38, 39) of FIG. 3, the signal transmission direction is limited to one way such that when an input signal is input through either of two input terminals 44 or 45, the input signal is output from output terminal 46 and that the opposite direction for the signal transmission is prohibited.

Figure 4:
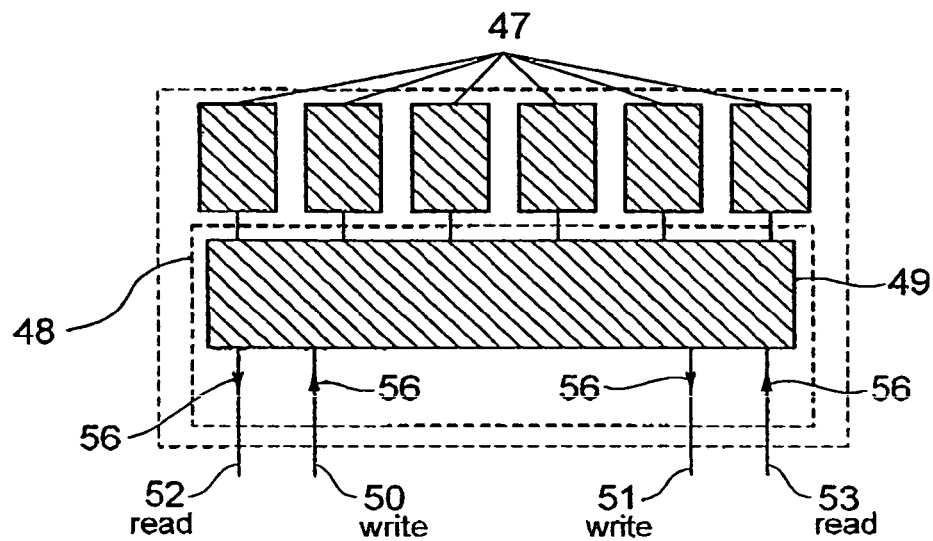
FIG. 4 is a block diagram showing the configuration of a memory module shown in FIG. 1.

FIG. 4 shows the configuration of the memory module 26 (27, 28, 29). The memory module 26 (27, 28, 29) has a plurality of memory devices 47 and a serial transmission buffer 48. The serial transmission buffer 48 has a serial/parallel conversion circuit 49 and input/output buffers 56 for the dedicated read line 52, 53 and dedicated write line 50, 51. In FIG. 4, interconnections of the control signal system are omitted for depiction. The memory module may have a single memory device instead.

When read data are to be output from the memory module 26, the parallel data read from the memory device 47 or memory devices 47 are converted into a serial data signal by the serial/parallel conversion circuit 49, which outputs the resultant serial data signal through the dedicated read line 52 to the outside of the memory module 26. When a read signal, i.e., a serial data signal is to be transmitted from another memory module, the read signal is input through the dedicated read line 53 to the memory module 26, passed straight through the serial/parallel conversion circuit 49, and output from the dedicated read line 52 without a change.

A write data signal to be written in the memory module 26 is input through the dedicated write line 50, converted into parallel data by the serial/parallel conversion circuit 49, and is written in the memory device 47 or memory devices 47. A serial data signal to be written in another memory module is input through the dedicated write line 50, passed straight through the serial/parallel conversion circuit 49, and is transmitted through the dedicated write line 51 without a change toward the another memory module. The above performance of the serial/parallel conversion circuit 49 is controlled by a control signal fed from the memory controller 25.

FIGS. 5 to 12 show the memory system shown in FIG. 1 in a normal signal transmission mode thereof and another signal transmission mode after a failure occurred in one of the memory modules 26 to 28. FIGS. 5, 7, 9 and 11 show the signal transmission mode of the memory system, while simplifying the representation of the configuration of FIG. 1, whereas FIGS. 6, 8, 10 and 12 which correspond to FIGS. 5, 7, 9 and 11, respectively, show the signal transmission mode of the memory system, while representing the memory system of FIG. 1 similarly to the representation of FIG. 15. In FIGS. 5, 7, 9 and 11, solid lines show that signal transmission is performed therethrough and dotted lines show that signal transmission is not performed therethrough.

Figure 5:
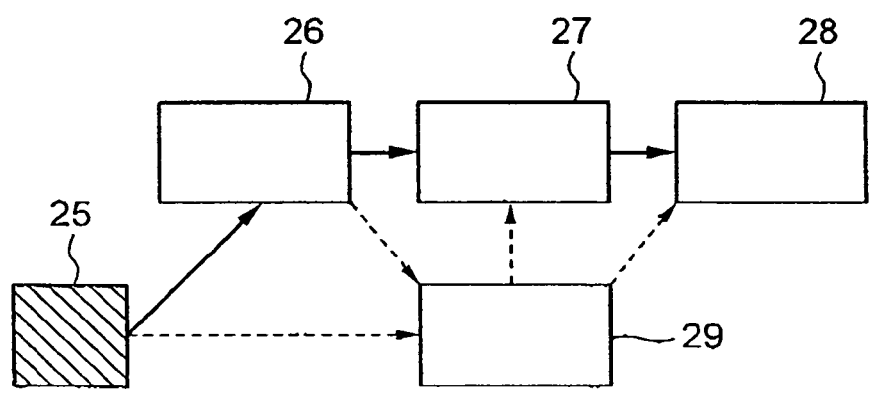
FIG. 5 is a block diagram showing the signal flow in a normal operation mode of the memory system shown in FIG. 1.
Figure 6:
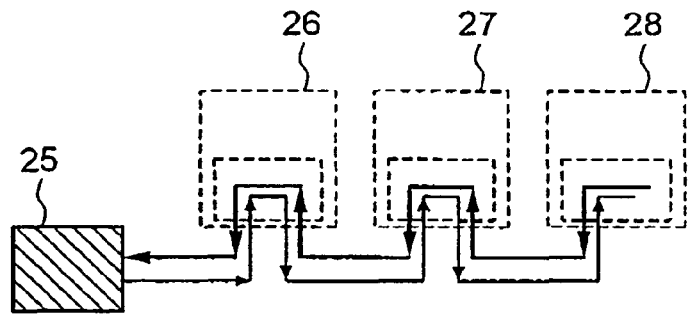
FIG. 6 is a block diagram showing the signal flow of FIG. 5, representing the memory system having both a dedicated read line and dedicated write line.

FIGS. 5 and 6 show the normal operation mode. In the normal operation mode, access to the backup memory module 29 is not made, and the memory controller 25 serially connects the normal memory modules 26, 27 and 28 that are in service in the order as recited herein. Power supply to the backup memory module 29 to which access is not made is stopped and, therefore, removal thereof and introduction of a new memory module in place thereof can be carried out while the operation of the system is being run.

If a single-bit error, for example, occurs for several times in the memory module 26 in the normal mode shown in FIGS. 5 and 6 and the memory controller 25 determines that the memory module 26 needs to be replaced, the memory controller 25 accesses the backup memory 29 and copies the data in the memory module 26 to the backup memory module 29. Thereafter, the normal operation mode shifts to the transmission mode shown in FIGS. 7 and 8. In this mode, the memory controller 25 determines that the connection of the memory modules is in the order of 29, 27, 28 and controls the access operation according to this order.

Power supply to the memory module 26 to which the memory access is not made is stopped and, therefore, removal thereof and introduction of a new memory module in place thereof can be carried out while the operation of the system is being run. In order to recover the original normal operation mode after the completion of replacement of the memory module 26, a command is issued to the memory controller 25 to restore the memory system to the normal operation mode in the order of steps opposite to the steps of the process for removing the memory module 26.

Figure 7:
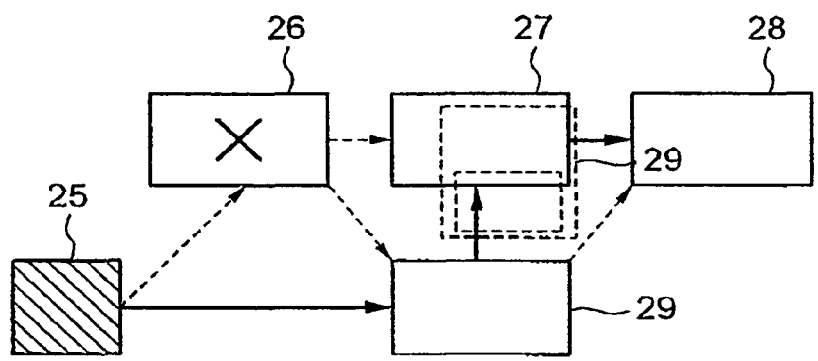
FIG. 7 is a block diagram showing the signal flow after a failure occurred in a memory module 26.
Figure 8:
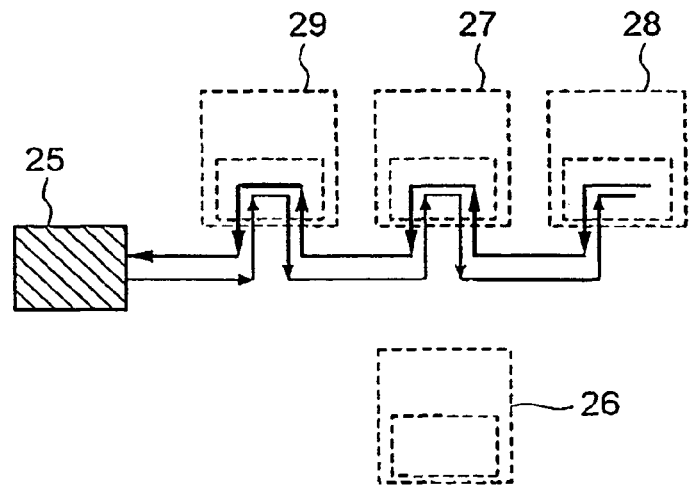
FIG. 8 is a block diagram showing the signal flow shown in FIG. 7, representing the memory system having both a dedicated read line and a dedicated write line.

In the transmission mode shown in FIGS. 7 and 8, power supply is started after the replacement of the filed memory module 26, and access from the memory controller 25 to a new memory module 26 is started to initialize the memory module 26. Thereafter, the data in the backup memory module 29 is copied to the memory module 26. After the completion of the data copy operation, connection between the memory module 26 and memory module 27 is started and, at the same time, signal transmission between the memory modules 27 and 29 and that between the memory controller 25 and backup memory module 29 are sequentially stopped. As a result, the system mode is set back to the normal operation mode shown in FIGS. 5 and 6.

Figure 9:
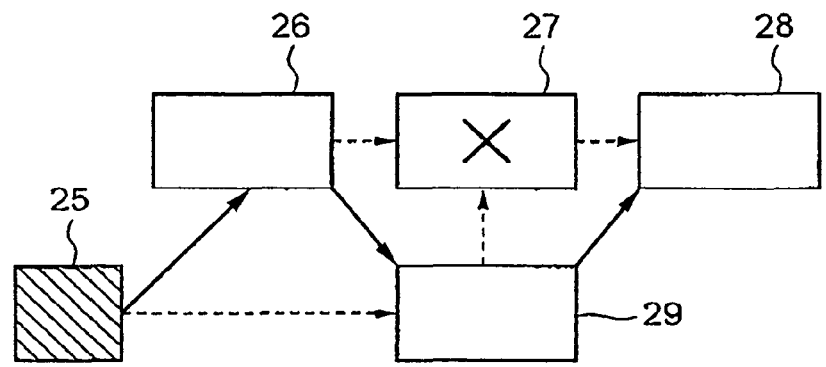
FIG. 9 is a block diagram showing the signal flow after a failure occurred in a memory module 27.
Figure 10:
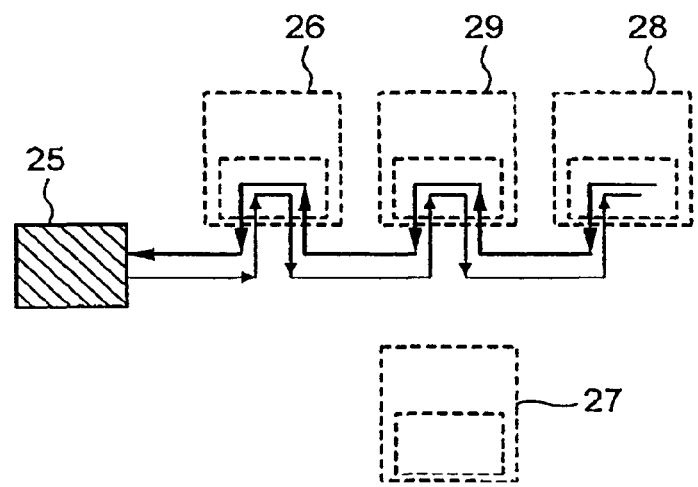
FIG. 10 is a block diagram showing the signal flow shown in FIG. 9, representing the memory system having both a dedicated read line and dedicated write line.
Figure 11:
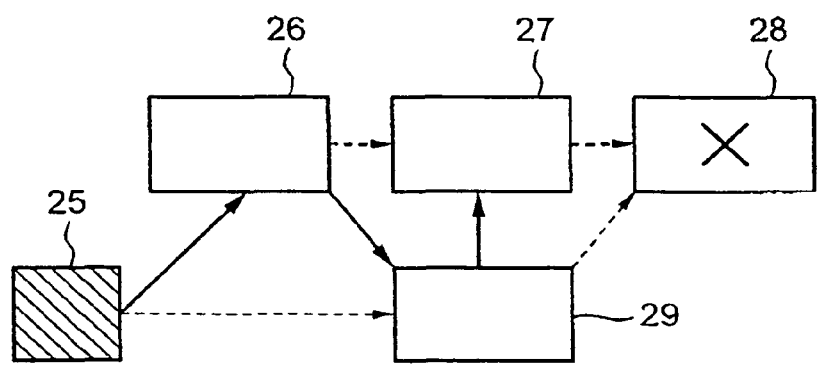
FIG. 11 is a block diagram showing the signal flow after a failure occurred in a memory module 28.
Figure 12:
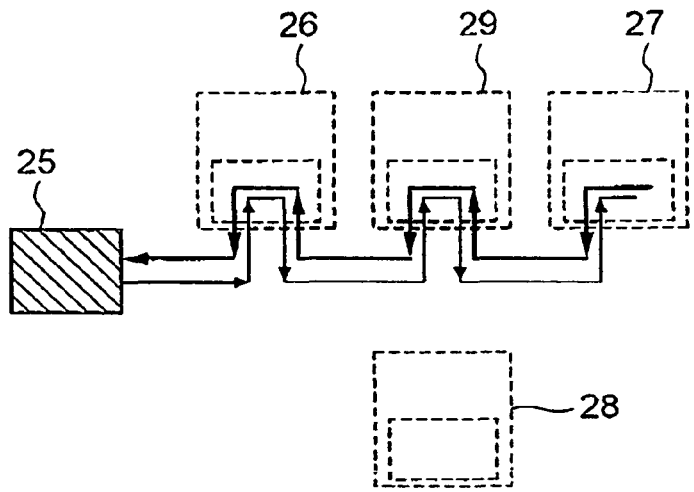
FIG. 12 is a block diagram showing the signal flow shown in FIG. 11, representing the memory system having both a dedicated read line and a dedicated write line.
Figure 13:
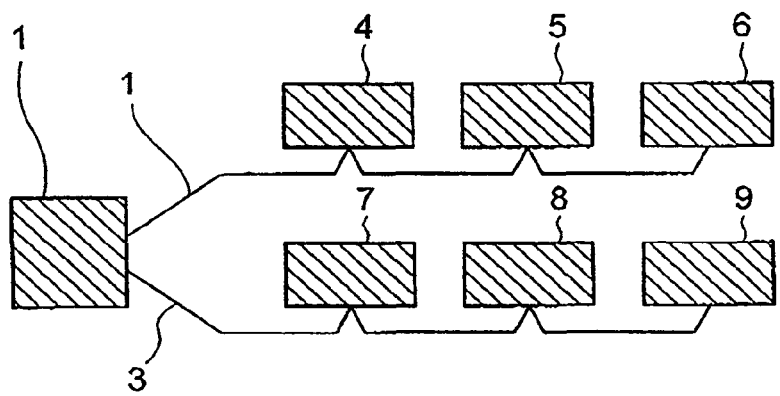
FIG. 13 is a block diagram showing a conventional memory system adopting a mirroring technique.
Figure 14:
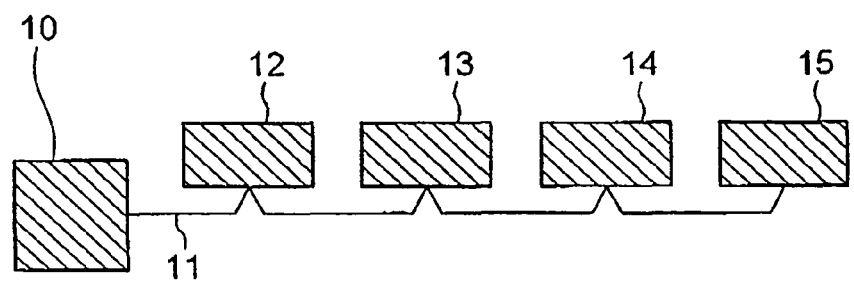
FIG. 14 is a block diagram showing a conventional memory system including a single backup memory.

FIGS. 9 and 10 show another transmission mode where the memory module 27 is failed. The memory controller 25 determines that the connection of the memory modules is in the order of 26, 29, 28 and controls the access operation according to this order. FIGS. 11 and 12 show another mode where the memory module 28 is failed. Similarly, the memory controller 25 determines that the connection of the memory modules is in the order of 26, 29, 27 and controls the access operation according to this order.

Although three normal memory modules and a single backup memory module are used in the above embodiment, the number of normal memory modules and that of backup memory modules may be selected at any number. Although a single read line and a single write line are shown in the drawings, the number of the read lines and that of write lines may be selected at any number that is greater than or equal to 1. The number of signal lines for the control is not limited. Although a single channel of the memory system is exemplified in the above embodiment, the number of channels may be selected at any number. Any configuration is selected for the switches 34, 35 and 36 so long as these switches can pass an input serial signal through one of the two output terminals in a controllable manner. Further, any configuration is selected for the transmission-direction limiting gate so long as the limiting gate drives a signal in a specific direction and stops a signal in the opposite direction.

Although the present invention has been described with reference to the preferred embodiment, the memory system and its hot-swap method according to the present invention are not limited to the configuration shown in the above embodiment and various changes, modifications, or alternations to the invention as described herein may be made, none of which depart from the spirit of the present invention. All such changes, modifications, and alternations should therefore be seen as within the scope of the present invention.

What is claimed is:

1. A memory system comprising:
   a plurality of normal memory modules serially connected by a dedicated signal write line and a dedicated signal read line for transferring read/write data;
   a backup memory module, the backup module not having an access to the read/write data transferred between the normal memory modules during normal operation of the normal memory modules; and
   a switch circuit connected to each of said normal memory modules and to said backup module, the switch circuit being operable to remove one of said normal memory modules from being serially connected to other normal memory modules without interrupting transmission between said other normal memory modules and to replace said one of said normal memory modules by said backup memory module by isolating said one of said normal memory modules and inserting said backup memory module to serially connect said backup memory module and said normal memory modules excepting said one of said normal memory modules.

2. A memory system comprising:
   a plurality of normal memory modules serially connected by a dedicated signal write line and a dedicated signal read line for transferring read/write data;

a backup memory module, the backup module not having an access to the read/write data transferred between the normal memory modules during normal operation of the normal memory modules; and a switch circuit connected to each of said normal memory modules and to said backup module, the switch circuit being operable to remove one of said normal memory modules from being serially connected to other normal memory modules without interrupting transmission between said other normal memory modules and to replace said one of said normal memory modules by said backup memory module by isolating said one of said normal memory modules and inserting said backup memory module to serially connect said backup memory module and said normal memory modules excepting said one of said normal memory modules, wherein said switch circuit includes at least one switch device having an input terminal and two output terminals, and at least one transmission-direction limiting device having two input terminals and an output terminal, said transmission-direction limiting circuit limits a signal transmission in a direction from either one of said two input terminals thereof to said output terminal thereof.

3. The memory system according to claim 2, wherein said transmission-direction limiting device includes first and second buffers connected at a first node in a cascade connection, and a third buffer having an output connected to said first node.

4. A method for hot-swapping in a memory system including a plurality of normal memory modules, a backup memory module, a signal write line and a signal read line for connecting said normal memory modules in a serial connection, said method comprising the steps of:

establishing a normal operation mode between said normal modules such that a read/write data is transferred between said normal modules and such that the backup module does not have an access to the read/write data transferred between the normal memory modules;

isolating one of the normal memory modules from the serial connection of the normal memory modules;

inserting the backup memory module in the serial connection of the normal memory modules excepting the isolated one of the normal memory modules; and removing the isolated one of the normal memory modules without interrupting transmission between other normal memory modules.

* * * * *